US010319665B2

(12) United States Patent
Maruyama

(10) Patent No.: US 10,319,665 B2
(45) Date of Patent: Jun. 11, 2019

(54) COOLER AND COOLER FIXING METHOD

(71) Applicant: FUJI ELECTRIC CO., LTD., Kawasaki-shi, Kanagawa (JP)

(72) Inventor: Ryo Maruyama, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 159 days.

(21) Appl. No.: 15/108,275

(22) PCT Filed: Apr. 23, 2015

(86) PCT No.: PCT/JP2015/062411
§ 371 (c)(1),
(2) Date: Jun. 24, 2016

(87) PCT Pub. No.: WO2015/194259
PCT Pub. Date: Dec. 23, 2015

(65) Prior Publication Data
US 2016/0307821 A1 Oct. 20, 2016

(30) Foreign Application Priority Data

Jun. 19, 2014 (JP) .................. 2014-126315

(51) Int. Cl.
*H01L 23/40* (2006.01)
*H01L 23/473* (2006.01)
(Continued)

(52) U.S. Cl.
CPC ...... *H01L 23/4006* (2013.01); *H01L 21/4882* (2013.01); *H01L 23/473* (2013.01);
(Continued)

(58) Field of Classification Search
CPC ............... H01L 23/4006; H01L 23/473; H01L 2023/4056; H01L 23/38; H01L 21/4882
See application file for complete search history.

(56) References Cited

U.S. PATENT DOCUMENTS 4,402,185 A * 9/1983 Perchak .................. H01L 23/38
257/E23.082
4,871,015 A * 10/1989 Foley .................. H01L 23/4006
165/76
(Continued)

FOREIGN PATENT DOCUMENTS

EP 2333476 A1 6/2011
JP 08321570 A 12/1996
(Continued)

OTHER PUBLICATIONS

JP2014033095A translation.*
(Continued)

*Primary Examiner* — Jon T. Schermerhorn, Jr.
(74) *Attorney, Agent, or Firm* — Holtz, Holtz & Volek PC

(57) ABSTRACT

A cooler for cooling a semiconductor module to be secured to a base, the cooler including: a cooler body that includes a refrigerant flow path surrounded by a first wall part having a first through-hole, a second wall part that is arranged facing the first wall part and that includes a connection region which is to be connected to the base at a position opposing the first through-hole, and a side wall part for connecting the periphery of the first wall part and the periphery of the second wall part; and a lid for closing off the first through-hole.

12 Claims, 10 Drawing Sheets

(51) Int. Cl.
*H01L 25/07* (2006.01)
*H01L 21/48* (2006.01)
*H01L 25/18* (2006.01)
*H01L 23/00* (2006.01)

(52) U.S. Cl.
CPC .............. *H01L 24/32* (2013.01); *H01L 25/07* (2013.01); *H01L 25/18* (2013.01); *H01L 2023/4031* (2013.01); *H01L 2023/4087* (2013.01); *H01L 2224/32225* (2013.01); *H01L 2924/0002* (2013.01); *H01L 2924/10272* (2013.01); *H01L 2924/1203* (2013.01); *H01L 2924/13055* (2013.01); *H01L 2924/13091* (2013.01); *H01L 2924/14252* (2013.01); *H01L 2924/15787* (2013.01)

(56) References Cited

U.S. PATENT DOCUMENTS

| | | | | |
|---|---|---|---|---|
| 4,938,280 | A | | 7/1990 | Clark |
| 5,563,447 | A | * | 10/1996 | Lake ..................... H01L 23/645 257/692 |
| 5,640,852 | A | * | 6/1997 | Atlas ..................... F25B 21/02 165/110 |
| 6,533,589 | B1 | * | 3/2003 | Palaniappa ............. H01L 23/32 439/331 |
| 6,808,015 | B2 | * | 10/2004 | Osakabe ............... F28D 15/0233 165/104.21 |
| 8,804,331 | B2 | * | 8/2014 | Refai-Ahmed ..... H01L 23/3672 165/104.33 |
| 2006/0245165 | A1 | | 11/2006 | Lin |
| 2011/0132591 | A1 | | 6/2011 | Morino et al. |
| 2011/0304979 | A1 | * | 12/2011 | Peterson ................... G06F 1/20 361/679.47 |
| 2012/0113598 | A1 | * | 5/2012 | Toh ..................... H01L 23/4006 361/715 |
| 2012/0175094 | A1 | | 7/2012 | Rice |
| 2013/0153186 | A1 | | 6/2013 | Gotou et al. |
| 2015/0061109 | A1 | * | 3/2015 | Iizuka ................... H01L 23/367 257/712 |

FOREIGN PATENT DOCUMENTS

| | | |
|---|---|---|
| JP | 09022971 A | 1/1997 |
| JP | 2002141450 A | 5/2002 |
| JP | 2008235725 A | 10/2008 |
| JP | 2012044119 A | 3/2012 |
| JP | 2012222069 A | 11/2012 |
| JP | 2014033095 A | 2/2014 |
| WO | 2014020808 A1 | 2/2014 |

OTHER PUBLICATIONS

Extended European Search Report (EESR) dated Sep. 11, 2017 issued in counterpart European Application No. 15810584.1.
International Search Report dated Jul. 14, 2015 issued in International Application No. PCT/JP2015/062411.

* cited by examiner

COOLER AND COOLER FIXING METHOD

TECHNICAL FIELD

The present invention relates to: a cooler for cooling a semiconductor module, the cooler comprising a refrigerant flow path even in connection regions used for securing the cooler to a base, and having high cooling efficiency and exceptional space-conserving properties; and a method for securing the cooler.

BACKGROUND ART

Electric power sources and electric motors in which inverter circuits having high energy-conversion efficiency are used, as well as hybrid cars, electric vehicles, and other apparatuses to which such electric power sources and electric motors are applied, are being introduced at an increasing rate as an approach towards lowering societal exposure to carbon. In these fields, rectifier diodes, power MOSFETs, IGBTs, thyristors, and the like, which are referred to as power semiconductor elements, are used in high-current control. There are cases where power semiconductor elements are individually incorporated into a circuit substrate; additionally, semiconductor modules in which a plurality of power semiconductor elements are integrated in a single package, or an intelligent power module (IPM) that is modularized with including control circuits, drive circuits, protection circuits, and the like, are also used.

Although power semiconductor elements are designed to reduce on-resistance, the amount of generated heat in accordance with high power output inevitably increases, and there are also fields in which a transition has already been made from air-cooled to liquid-cooled devices. In particular, it is preferable for semiconductor modules in which a plurality of power semiconductor elements are mounted to be of the liquid-cooled type from the standpoint of cooling efficiency due to the high amount of generated heat. However, when semiconductor modules are of the liquid-cooled type, circulation pumps, secondary coolers, and other auxiliary equipment is added, increasing the number of components; therefore, it is necessary to make the individual components as compact as possible. In particular, because the mount space for use in an electric vehicle is limited, making the semiconductor module and cooler more compact is one of the highest-priority problems.

In making the cooler more compact, it is most important to optimize the structure of partition walls and cooling fins installed in flow paths through which refrigerant is caused to flow; however, it is also important to reduce the size of the assembly required for attaching the cooler to a base.

Cited documents 1-4 disclose securing methods for securing a cooler to a semiconductor module by fastening using screws.

PRIOR ART DOCUMENTS

Patent Documents

[Patent Document 1] Japanese Laid-Open Patent Application No. 8-321570
[Patent Document 2] Japanese Laid-Open Patent Application No. 9-22971
[Patent Document 3] Japanese Laid-Open Patent Application No. 2002-141450
[Patent Document 4] Japanese Laid-Open Patent Application No. 2008-235725

DISCLOSURE OF THE INVENTION

Problems to be Solved by the Invention

However, there have conventionally been employed structures in which the cooler is fastened to the base using bolts, screws, or other securing members that pass through the cooler body. As it is impossible to provide a refrigerant flow path in the locations where the securing members pass through, bypassing flow paths are to be installed, and the risk of hot spots forming due to insufficient cooling has been presented. When the cooling fins or partition walls are to be installed inside the cooler, the locations at which the securing members pass through obstruct installation of the cooling fins or partition walls, making it difficult to achieve an arrangement in which cooling efficiency is prioritized.

Accordingly, it is an object of the present invention to provide: a cooler for cooling a semiconductor module, wherein the cooler comprises a refrigerant flow path even in connection regions used for securing the cooler to a base, and has high cooling efficiency and exceptional space-conserving properties; and a method for securing the cooler.

Means to Solve the Problems

In order to achieve the above object, the cooler of the present invention is the one for cooling a semiconductor module to be secured to a base, wherein the cooler is characterized in comprising: a cooler body that comprises a refrigerant flow path surrounded by a first wall part having a first through-hole, a second wall part that is arranged facing the first wall part and that comprises a connection region which is to be connected to the base at a position opposing the first through-hole, and a side wall part for connecting the periphery of the first wall part and the periphery of the second wall part; and a lid for closing off the first through-hole.

Additionally, in the cooler of the present invention, it is preferable that a second through-hole be provided in the connection region of the second wall part, and the cooler comprise a securing member small enough to be capable of passing through the first through-hole, the securing member being inserted through the second through-hole to secure the cooler body to the base.

Additionally, in the cooler of the present invention, it is preferable that the refrigerant-flow-path-side inner diameter of the second through-hole be greater than the base-side inner diameter thereof.

Additionally, in the cooler of the present invention, it is preferable that the securing member be a screw comprising a head part and a screw part, and a groove be provided to the refrigerant-flow-path side of the second through-hole so as to accommodate the head part of the screw, the groove being arranged such that the head part do not protrude into the refrigerant flow path.

Additionally, in the cooler of the present invention, it is preferable that the cooler comprise a seal member between the second through-hole and the securing member.

Additionally, in the cooler of the present invention, it is preferable that a wall part be provided in the connection region of the second wall part such that the wall thickness of the wall part is less than the wall thickness in other regions of the second wall part.

Additionally, in the cooler of the present invention, it is preferable that a plurality of fins be connected so as not to block the first through-hole on the refrigerant-flow-path side of the first wall part.

Additionally, in the cooler of the present invention, it is preferable that the lid be formed so as to be detachable from the first wall part.

Additionally, in the cooler of the present invention, it is preferable that the lid be installed so as not to protrude into the refrigerant flow path.

Additionally, in the cooler of the present invention, it is preferable that the semiconductor module is to be secured to the outer side of the first wall part, and the thickness of the first wall part be less than that of the second wall part.

The securing method for securing the cooler of the present invention is the one for securing a cooler for cooling a semiconductor module to a base, wherein the method is characterized in comprising: a first step for preparing a cooler comprising a cooler body that comprises a refrigerant flow path surrounded by a first wall part having a first through-hole, a second wall part that is arranged facing the first wall part and that comprises a connection region which is to be connected to the base at a position opposing the first through-hole, and a side wall part for connecting the periphery of the first wall part and the periphery of the second wall part, the cooler also comprising a lid for closing off the first through-hole; a second step for positioning the outer side of the second wall part with respect to the base and bringing the second wall part into contact therewith; a third step for inserting a connection means through the first through-hole and securing the connection region to the base; and a fourth step for closing off the first through-hole using the lid.

Additionally, in the securing method for securing the cooler of the present invention, it is preferable that: in the first step, a cooler having a second through-hole in the connection region of the second wall part be used as the cooler; and in the third step, a securing member small enough to be capable of passing through the first through-hole and being inserted through the second through-hole to secure the cooler body to the base be used as the connection means, a securing hole be provided in a portion of the base with which the connection region is in contact, and the securing member be inserted into the cooler through the first through-hole, furthermore inserted through the second through-hole from the inner side of the cooler, and secured in the securing hole in the base.

Additionally, in the securing method for securing the cooler of the present invention, it is preferable that in the third step, a welding tool be used as the connection means, and the welding tool be inserted into the cooler through the first through-hole to weld and secure the connection region to the base.

Advantageous Effects of the Invention

According to the present invention, it is possible to provide: a cooler for cooling a semiconductor module, wherein the cooler comprises a refrigerant flow path even in connection regions used for securing the cooler to a base, and has high cooling efficiency and exceptional space-conserving properties; and a method for securing the cooler.

BEST MODE FOR CARRYING OUT THE INVENTION

In the present invention, there is no particular limitation as to the configuration of the semiconductor module; for example, the present invention can be applied to a semiconductor module having an inverter circuit as described below.

Figure 1:
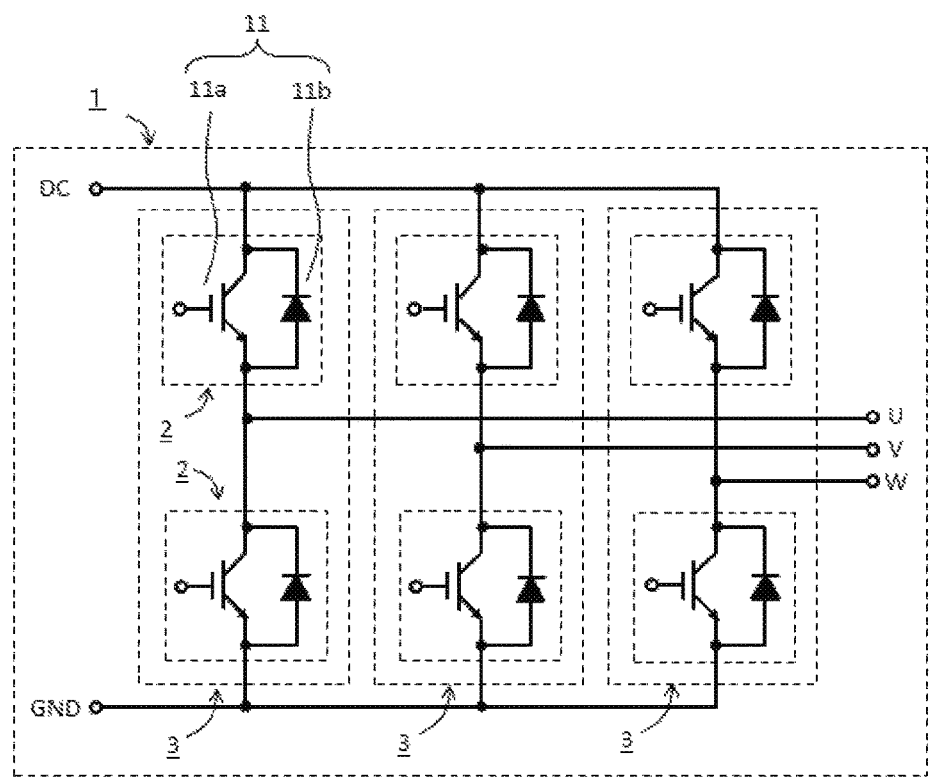
FIG. 1 is a schematic diagram of one example of a semiconductor-module circuit.

FIG. 1 shows an inverter circuit 1 for converting direct-current power to three-phase alternating-current power. The inverter circuit 1 is configured by connecting half-bridges 3 in parallel, the half-bridges 3 being configured by connecting element pairs 2 in series, and the element pairs 2 being configured from one each of a semiconductor element (transistor) 11a and a semiconductor element (diode) 11b.

Figure 2:
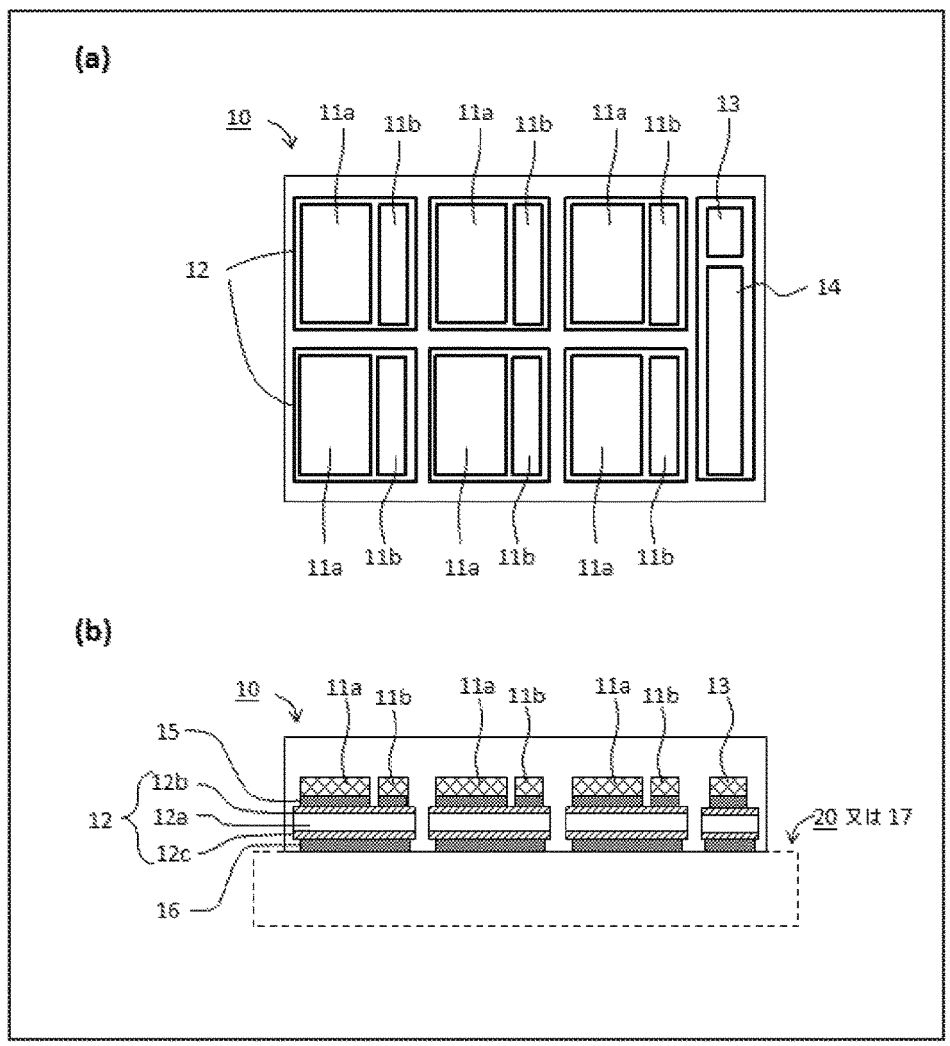
FIG. 2 is a schematic diagram of one example of the structure of the semiconductor module.

FIG. 2(a) shows a top-view schematic diagram of a semiconductor module 10 on which the inverter circuit 1 is mounted. Specifically, it is possible for one of each of the semiconductor elements (transistors) 11a and the semiconductor elements (diodes) 11b to be mounted on a substrate 12 and electrically connected by a conducting wire (not shown) to constitute the element pairs 2 shown in FIG. 1. Substrates 12 can be mounted on the semiconductor module 10 in two rows and three columns to yield a total of six, and electrically connected by conducting wires in accordance with the circuit diagram shown in FIG. 1 to constitute the inverter circuit 1.

Additionally, it is possible to mount a control integrated circuit 13 comprising gate-drive control and/or a circuit protection function (addressing short-circuiting, overcurrents, reductions in control-power-source voltage, overheating, etc.) for the semiconductor element (transistor) 11a on the semiconductor module 10. A power semiconductor module comprising a control integrated circuit 13 is referred to as an intelligent power module (IPM).

Additionally, it is possible to mount a passive element 14 such as a capacitor, resistor, and/or thermistor on the semiconductor module 10, as necessary, in order to suppress noise and measure temperature.

FIG. 2(b) shows a cross-sectional schematic diagram of the semiconductor module 10.

The substrates 12 are configured such that conductive layers 12b, 12c are formed on the obverse and reverse surfaces of an insulating substrate 12a. The insulating substrate 12a preferably is a ceramic substrate made from aluminum nitride, aluminum oxide, or the like, and has exceptional thermal conductivity. The conductive layers 12b, 12c can be formed from copper or another such metal.

The semiconductor element (transistor) 11a and the semiconductor element (diode) 11b can be joined to the conductive layer 12b with a solder layer 15 interposed therebetween.

According to one embodiment of the present invention, the conductive layer 12c on the reverse surface of the substrate 12 can be joined directly to the cooler 20 with a solder layer 16 interposed therebetween.

According to another embodiment of the present invention, the conductive layer 12c on the reverse surface of the substrate 12 can be joined to a base plate 17 made of copper or nickel-plated aluminum with a solder layer 16 interposed therebetween, while a thermal grease is applied to the reverse surface of the base plate 17, and the base plate 17 being pressed against the cooler 20.

After the semiconductor elements (transistors) 11a, the semiconductor elements (diodes) 11b, the control integrated circuit 13, the passive element 14, and the substrate 12 are wired using the conductive wire, the semiconductor module 10 can be filled and sealed with a thermosetting resin containing silicone gel or glass filler.

The cooler of the present invention can be used in cooling not only a semiconductor module such as is described above, but also that configured from a single chip including a large-scale integrated circuit, a discrete semiconductor, a passive element, a chip resistor, or a chip inductor.

Insulated gate bipolar transistors (IGBTs) or SiC-MOSFETs having low on-resistance and high switching speed can be used in the semiconductor element (transistor) 11a.

Additionally, SiC diodes having low on-resistance and high breakdown voltage can be used in the semiconductor element (diode) 11b.

Power MOSFETs conventionally structured formed on the Si substrate have higher on-resistance and poorer performance than do IGBTs or SiC-MOSFETs when used as the semiconductor element (transistor) 11a, but due to having body diodes built-in, such power MOSFETs obviate the semiconductor element (diode) 11b. Therefore, it is possible to integrate the inverter circuit on a single chip, and use this inverter circuit in low-power applications.

The present invention relates to a cooler 20 used for cooling a semiconductor module 10 such as is described above, and a method for securing the cooler. Specifically, as shown in FIG. 3(b), the cooler 20 to have the semiconductor module 10 arranged thereon is used upon having been secured to a particular kind of base 30.

In conventional practice, in order to secure the cooler 20 to the base 30, through-holes are formed in the cooler 20 in portions other than those where the refrigerant flow path is formed, and bolts or other screws that are inserted through the through-holes secure the cooler 20 to the base 30. However, in such a structure, it is necessary to form the refrigerant flow path so as to avoid the through-holes, and drawbacks such as an increase in the size of the cooler, or an adverse impact on the flow in the refrigerant flow path, are presented. The present invention was achieved in order to overcome such drawbacks.

Figure 3:
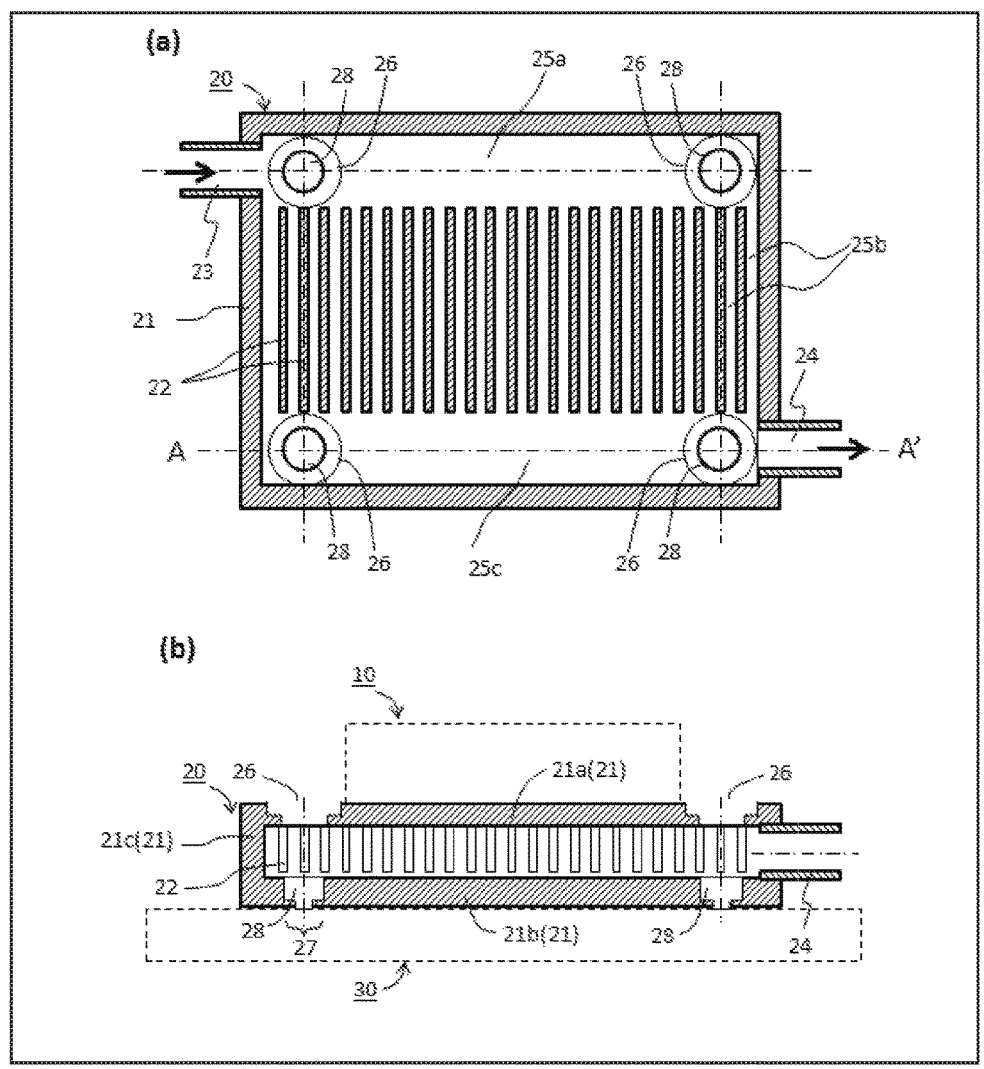
FIG. 3 is a structural schematic diagram according to a first embodiment of the cooler of the present invention.
Figure 4:
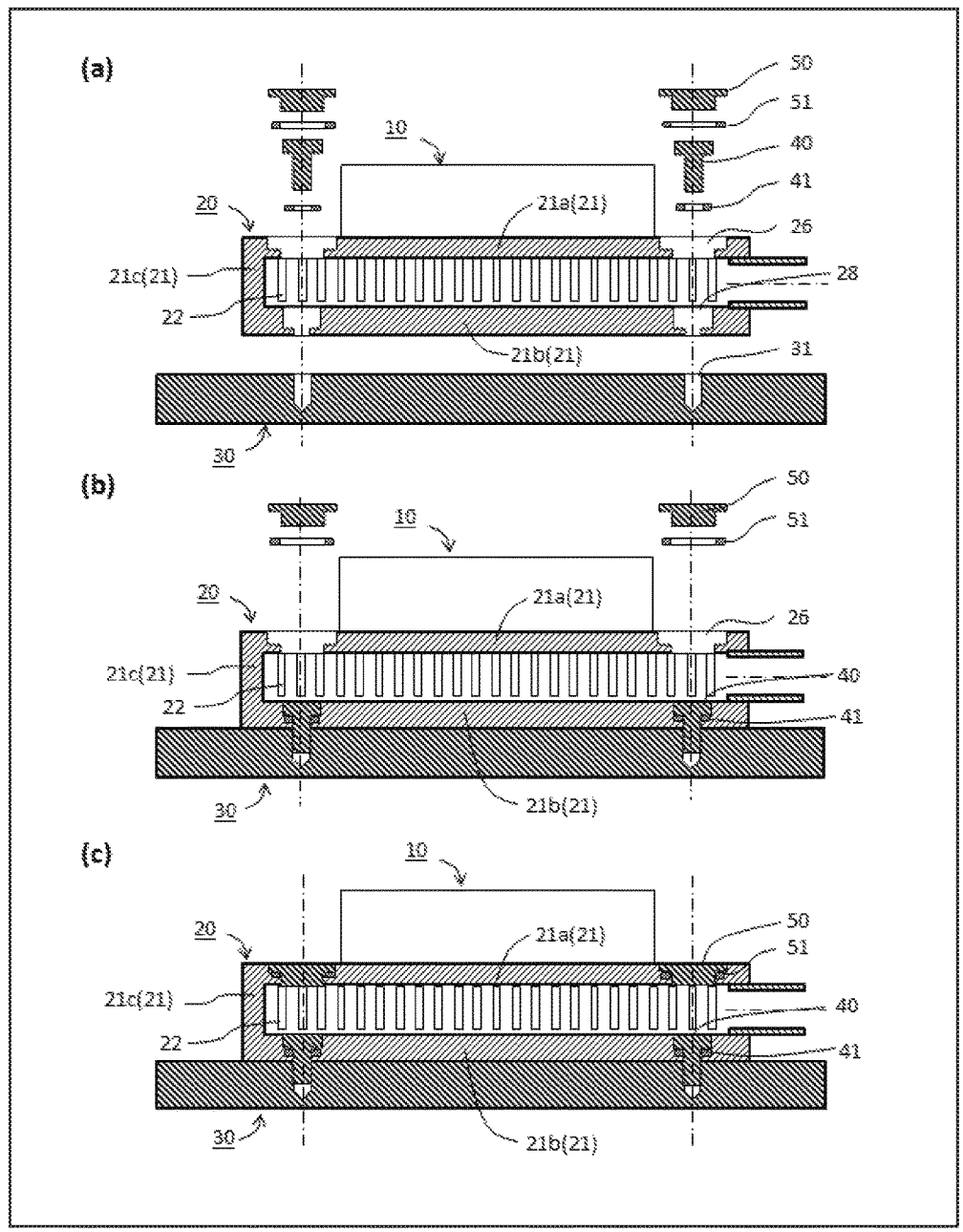
FIG. 4 is a schematic diagram of an assembly sequence according to the first embodiment of the cooler of the present invention.

Next, a first embodiment of the cooler and the method for securing the cooler according to the present invention is described with reference to FIGS. 3 and 4. FIG. 3(a) shows a top-view schematic diagram of a cooler 20 according to the first embodiment of the present invention, and FIG. 3(b) shows a cross-sectional schematic diagram along line A-A' in FIG. 3(a).

The cooler 20 of the present invention comprises a wall part 21, cooling fins 22, a refrigerant inlet 23, and a refrigerant outlet 24. The wall part 21 comprises: a first wall part 21a having first through-holes 26, the first wall part 21a being to be joined to the semiconductor module 10; a second wall part 21b that is arranged facing the first wall part 21a and that comprises connection regions 27 at positions opposing the first through-holes 26, the connection regions 27 being to be connected to the base 30; and a side wall part 21c for connecting the periphery of the first wall part 21a and the periphery of the second wall part 21b. The second wall part 21b comprises second through-holes 28 in the connection regions 27. A refrigerant introduction flow path 25a, cooling flow paths 25b, and a refrigerant discharge flow path 25c are formed in the space surrounded by the first wall part 21a, second wall part 21b, and side wall part 21c. In the present invention, all of these flow paths are collectively referred to as the "flow path."

The cooling fins 22 are connected to the first wall part 21a. Pin fins, blade fins, or corrugated fins can be used as the cooling fins 22. The pins of pin fins can be shaped as round or quadrilateral columns, and can be arranged in a rectangular or staggered configuration. Blade fins and corrugated fins may be straight in shape so as to form a linear flow path; alternatively, such fins may be configured as waving fins in which the fins are made to undulate in a wave shape, or as offset fins in which the fins are arrayed so as to be divided in the longitudinal direction and offset in the horizontal direction, so as to form a meandering flow path.

The wall part 21 and cooling fins 22 are preferably formed using a material having high thermal conductivity; e.g., aluminum, an aluminum alloy, copper, a copper alloy, or another such metal material. The wall part 21 and cooling fins 22 are preferably integrally molded by welding or casting in order to increase their thermal conductivity.

In the cooler 20, the refrigerant inlet 23 and the refrigerant outlet 24 are arranged at opposite corners of the wall part 21 of the cooler. Additionally, the first through-holes 26 and the second through-holes 28 are arranged at the four corners of the wall part 21 of the cooler.

During use of the cooler 20, refrigerant flows in from the refrigerant inlet 23 into the refrigerant introduction flow path 25a, and flows in a dispersed manner through the plurality of cooling flow paths 25b formed between the cooling fins 22, the refrigerant being collected in the refrigerant discharge flow path 25c and discharged from the refrigerant outlet 24. The first wall part 21a and the cooling fins 22 are cooled by the refrigerant, and the semiconductor module 10 is cooled by the cooled first wall part 21a.

Next, the method for securing the cooler 20 described above to the base 30 is described. FIG. 4(a) shows the cooler 20 in a state prior to a securing operation. FIG. 4(b) shows the cooler 20 in a state during the securing operation. FIG. 4(c) shows the cooler 20 in a state after the securing operation.

In the present embodiment, securing holes 31 for securing the cooler 20 are provided in the base 30. Additionally, the inner diameter of the first through-holes 26 is large enough that securing members 40 and seal members 41 are capable of passing therethrough, the cooling fins 22 being arranged so as not to block the first through-holes 26 and configured so as not to obstruct the passage of the securing members 40 and seal members 41.

Additionally, the refrigerant introduction flow path 25a- and refrigerant discharge flow path 25c-side inner diameter of the second through-holes 28 is greater than the base 30-side inner diameter of the second through-holes 28. The portions in which the inner diameter of the second through-holes 28 is increased constitute "grooves" in the present invention.

Additionally, the securing members 40 are preferably screws comprising a head part and a screw part. In cases in which the securing members 40 comprise screws, the securing holes 31 are configured as screw holes into which the screws are threaded. The grooves are provided on the refrigerant-flow-path side of the second through-holes 28 such that the securing members 40 and seal members 41 are accommodated, the grooves being configured such that the head parts of the securing members 40 do not protrude into the refrigerant flow path.

There is no particular limitation as to the shape of the screws; however, the head parts are preferably level, as in a low-head screw, flat screw, pan-head screw, or countersunk screw, among which those of the low-head and flat screws are particularly preferred.

There is no particular limitation as to the seal members 41; it is possible to use O-rings, rubber gaskets, PTFE punched gaskets, seal tape, or a liquid seal material.

The step for preparing a cooler 20 such as is described above is the first step in the present invention.

As shown in FIG. 4(b), to secure the cooler 20 to the base 30, the cooler 20 is positioned and installed on the base 30, and the outer side of the second wall part 21b is brought into contact with the base 30. This step is the second step in the present invention.

In this state, the securing members 40 and seal members 41 are inserted from the first through-holes 26, and the securing members 40 are inserted into the second through-holes 28 from the inner side of the cooler 20 with the seal members 41 interposed therebetween, and then inserted and secured in the securing holes 31 in the base 30. In cases in which the securing members 40 comprise screws, the securing members 40 are screwed and fastened into the securing holes 31, whereby the securing members 40 are secured. The second through-holes 28 are sealed in an airtight manner by the seal members 41 sandwiched between the second wall part 21b and the head parts of the securing members 40. The step described above is the third step in the present invention.

The lids 50 can then be secured by being inserted into the first through-holes 26 with seal members 51 interposed therebetween, whereby the first through-holes 26 can be closed off in an airtight manner. This step is the fourth step in the present invention.

The lids 50 are preferably installed so as not to protrude into the refrigerant flow path. Additionally, the lids 50 are preferably detachable from the first wall part 21a; it is possible to use, e.g., screws comprising a head part and a screw part. In such a case, the inner peripheries of the first through-holes 26 are formed as screw grooves into which the screw parts of the lids 50 are threaded.

As a result, the refrigerant introduction flow path 25a and the refrigerant discharge flow path 25c are reliably provided between the lids 50 closing off the first through-holes 26 and the securing members 40 inserted into the second through-holes 28, and the refrigerant flow path can be formed even in portions which are connection regions having the first through-holes 26 and second through-holes 28. Therefore, it is possible to make the cooler 20 more compact, as well as to straighten the refrigerant introduction flow path 25a and refrigerant discharge flow path 25c and improve the flow of refrigerant.

Figure 5:
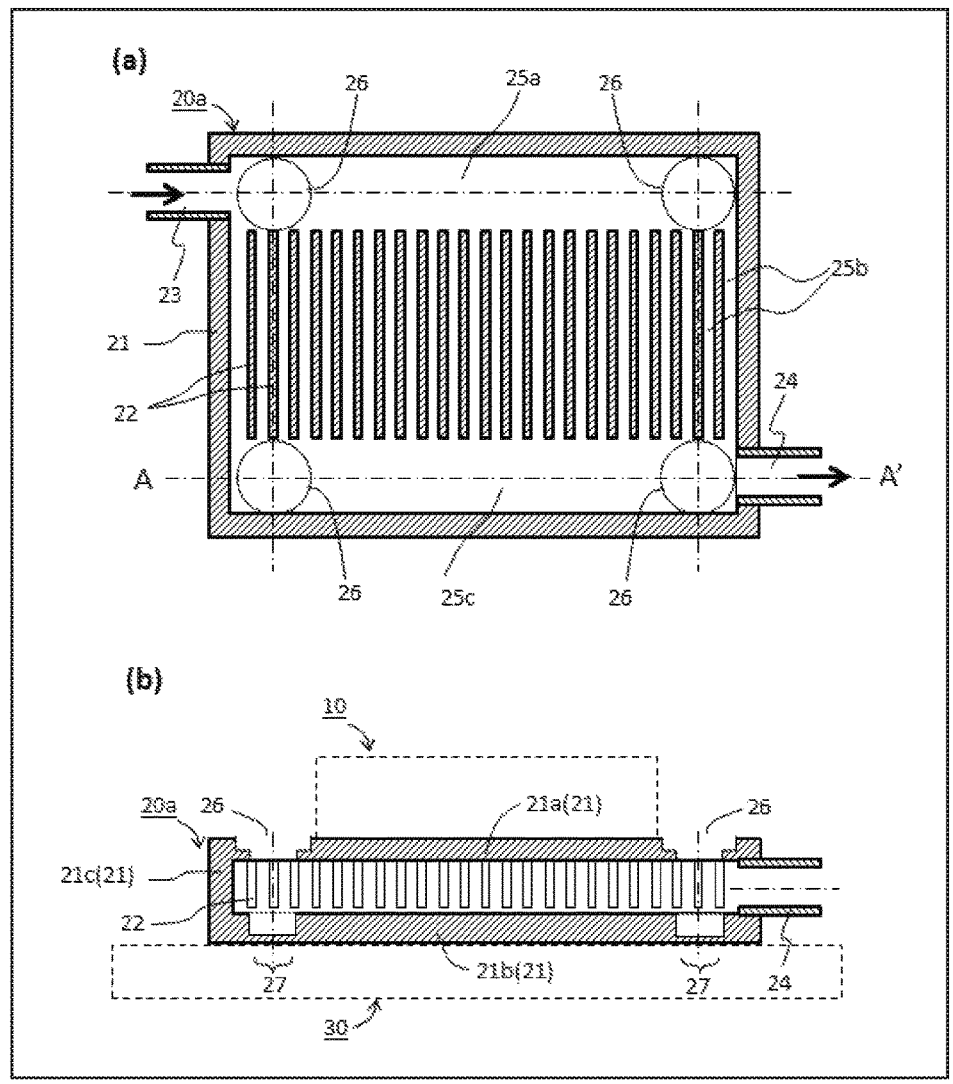
FIG. 5 is a structural schematic diagram according to a second embodiment of the cooler of the present invention.
Figure 6:
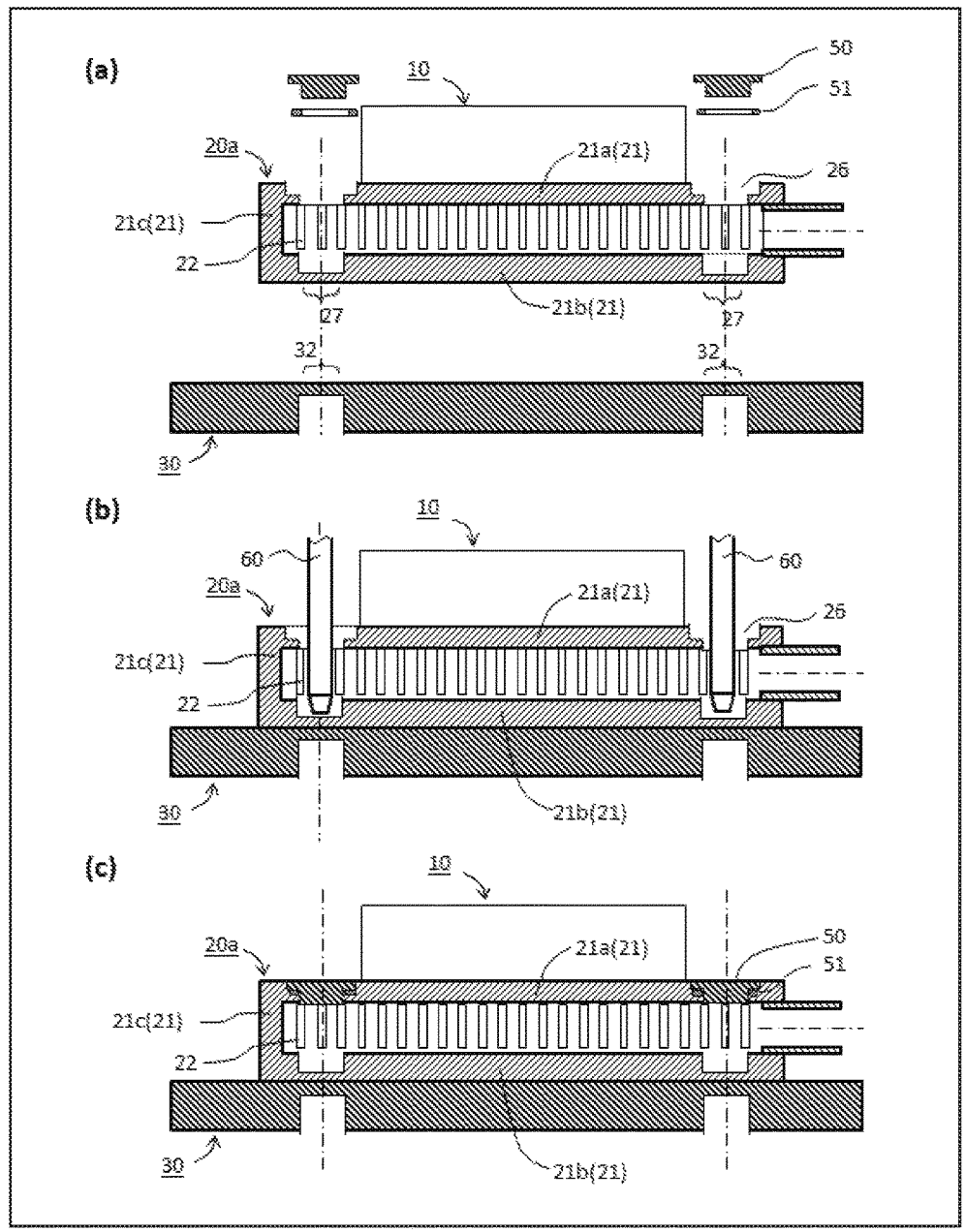
FIG. 6 is a schematic diagram of an assembly sequence according to the second embodiment of the cooler of the present invention.

Next, a second embodiment of the cooler and the method for securing the cooler of the present invention is described with reference to FIGS. 5 and 6. FIG. 5(a) shows a top-view schematic diagram of a cooler 20a according to the second embodiment of the present invention, and FIG. 5(b) shows a cross-sectional schematic diagram along line A-A' in FIG. 5(a).

The cooler 20a comprises a wall part 21, cooling fins 22, a refrigerant inlet 23, and a refrigerant outlet 24. The wall part 21 comprises: a first wall part 21a having first through-holes 26, the first wall part 21a being to be joined to the semiconductor module 10; a second wall part 21b that is arranged facing the first wall part 21a and that comprises connection regions 27 at positions opposing the first through-holes 26, the connection regions 27 being to be connected to the base 30; and a side wall part 21c for connecting the periphery of the first wall part 21a and the periphery of the second wall part 21b.

According to the second embodiment of the present invention, in the connection regions 27, it is preferable that cavities are formed from the inner side of the cooler 20a, and the wall thickness of the second wall part 21b is reduced.

It is possible to use a cooler 20a that is the same as in the first embodiment of the present invention with respect to the wall part 21, cooling fins 22, refrigerant inlet 23, and refrigerant outlet 24, with the exception of the shape of the connection regions 27.

Next, the method for securing the cooler 20a to the base 30 is described. FIG. 6(a) shows the cooler 20a in a state prior to a securing operation. FIG. 6(b) shows the cooler 20a in a state during the securing operation. FIG. 6(c) shows the cooler 20a in a state after the securing operation.

In the second embodiment of the present invention, cavities may be formed, in connection regions 32, in the surfaces of the base 30 opposite those in contact with the cooler 20a, and the wall thickness of the connection regions 32 may be reduced.

Additionally, the inner diameter of the first through-holes 26 can be large enough that connection means 60 can pass therethrough, the cooling fins 22 being arranged so as not to block the first through-holes 26 and configured so as not to obstruct the passage of the connection means 60. The step for preparing such a cooler 20a is the first step in the present invention.

In the present embodiment, a welding tool is used as the connection means 60. A tool for spot-welding (lap resistance welding) or laser-welding, which only minimally damages the parent material of the cooler 20a, is preferred as the welding tool.

First, the cooler 20a is positioned and installed on the base 30, and the outer side of the second wall part 21b is brought into a state of contact with the base 30. This step is the second step in the present invention.

In this state, the welding tool constituting the connection means 60 is inserted from the first through-hole 26, and the connection region 27 of the cooler 20a are welded to the connection region 32 of the base 30, whereby the cooler 20a is secured to the base 30. This step is the third step in the present invention.

The connection means 60 comprising the welding tool is then withdrawn from the first through-hole 26, and the first through-hole 26 are closed off by the lid 50 and the seal member 51. This step is the fourth step in the present invention.

In the second embodiment of the present invention, a brazing tool or the like can be used as the connection means 60 instead of a welding tool. In this case, a brazing material is provided between the connection region 27 of the second wall part 21b and the connection region 32 of the base 30.

Other embodiments of the cooler 20 of the present invention are described below.

Figure 7:
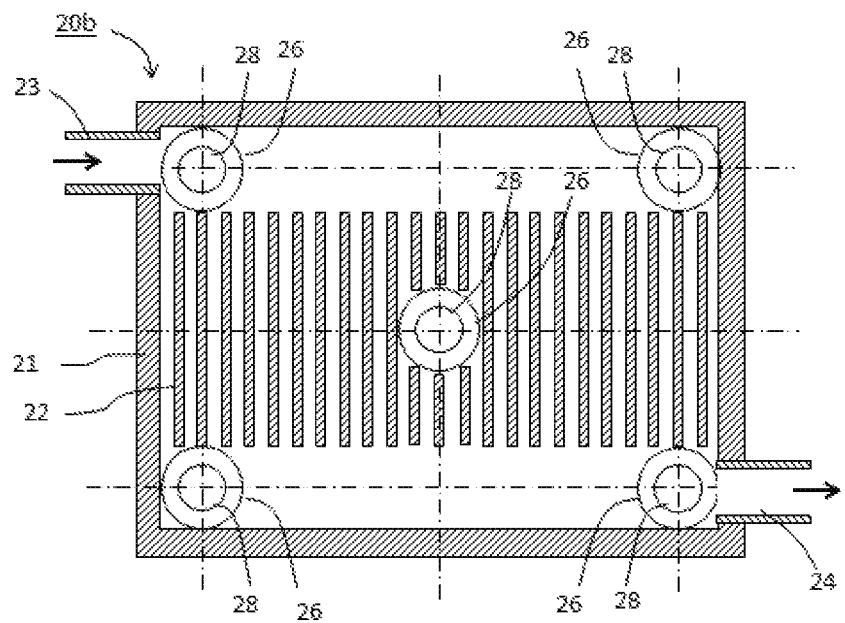
FIG. 7 is a structural schematic diagram of another embodiment in which the connection region of the cooler of the present invention has been modified.

In the cooler 20b shown in FIG. 7, a portion excluding the cooling fins 22 is provided at the central part of the refrigerant flow path, and a first through-hole 26 and a second through-hole 28 are provided even in this portion. In this case, because even the central part of the refrigerant flow path can be secured to the base, the cooler can be firmly secured even when of large size.

Figure 8:
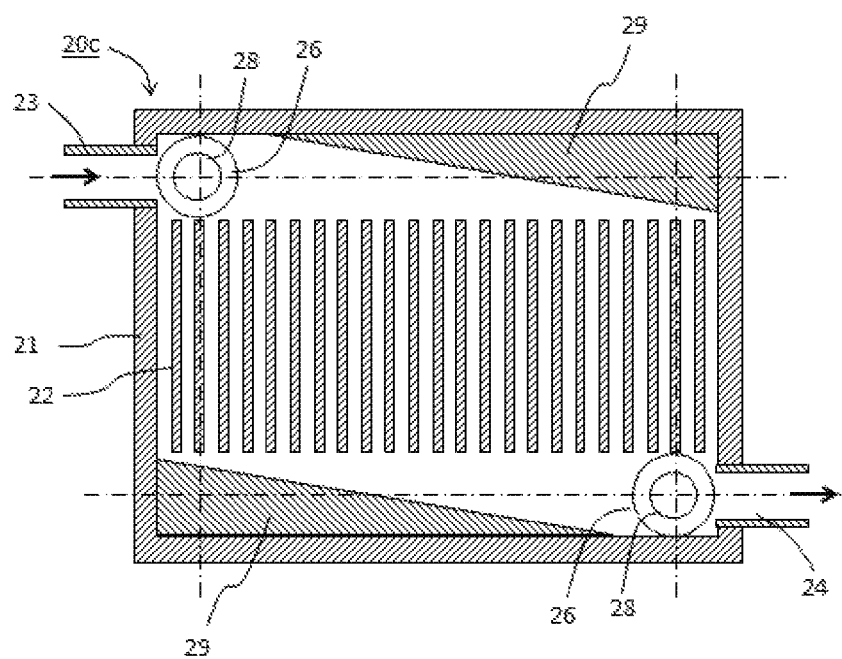
FIG. 8 is a structural schematic diagram of further another embodiment in which the connection region of the cooler of the present invention has been modified.

In the cooler 20c shown in FIG. 8, the first through-holes 26 and second through-holes 28 arranged in the four corners of the wall part 21 of the cooler are reduced to two in number, arranged at two opposite corners, and guide walls 29 are arranged at the vacant locations to control the flow of refrigerant and configured so as to prevent the formation of hot spots.

Figure 9:
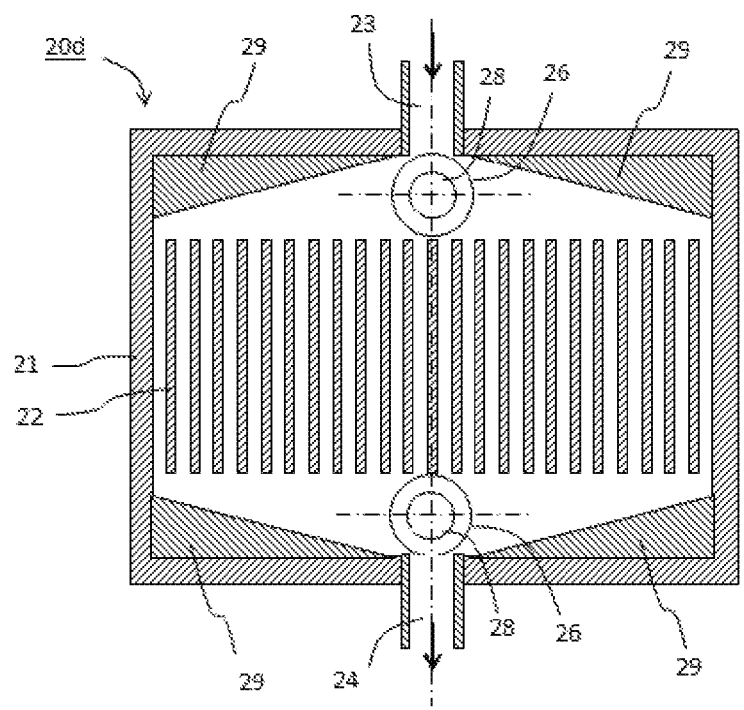
FIG. 9 is a structural schematic diagram of further another embodiment in which the connection region of the cooler of the present invention has been modified.

In the cooler 20d shown in FIG. 9, the refrigerant inlet 23, refrigerant outlet 24, first through-holes 26, and second through-holes 28 are arranged on the central axis of the wall part 21 of the cooler, and guide walls 29 are arranged in the four vacant corners.

Figure 10:
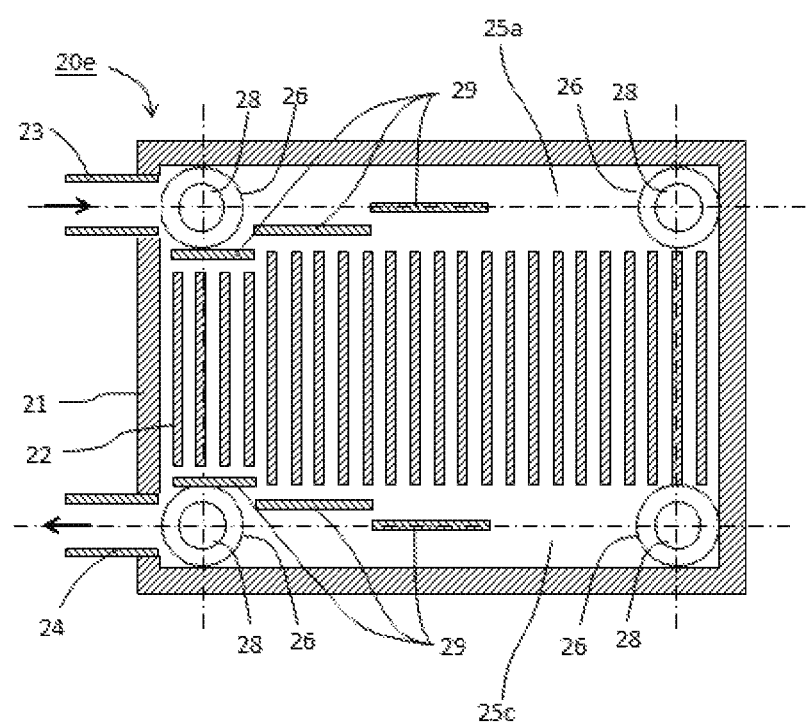
FIG. 10 is a structural schematic diagram of further another embodiment in which the connection region of the cooler of the present invention has been modified.

In the cooler 20e shown in FIG. 10, the refrigerant inlet 23 and refrigerant outlet 24 are arranged on one side of the wall part 21 of the cooler, and guide walls 29 are arranged in the refrigerant discharge flow path 25a and refrigerant introduction flow path 25c in order to achieve uniformity in flow volume.

Thus, according to the present invention, it is possible to set the positions of the first through-holes 26 and second through-holes 28 with relative freedom in accordance with the design of the refrigerant flow path, and to contribute to improving the cooling efficiency of the cooler.

EXPLANATION OF NUMERALS AND CHARACTERS

1 Inverter circuit
2 Element pair
3 Half-bridge
10 Semiconductor module
11 Semiconductor element
11a Semiconductor element (transistor)
11b Semiconductor element (diode)
12 Substrate
12a Insulating substrate
12b, 12c Conductive layer
13 Control integrated circuit
14 Passive element
15, 16 Solder layer
17 Base plate
20, 20a, 20b, 20c, 20d, 20e Cooler
21 Wall part
21a First wall part
21b Second wall part
21c Side wall part
22 Cooling fin
23 Refrigerant inlet
24 Refrigerant outlet
25a Refrigerant introduction flow path
25b Cooling flow path
25c Refrigerant discharge flow path
26 First through-hole
27, 32 Connection region
28 Second through-hole
29 Guide wall
30 Base
31 Securing hole
40 Securing member
41, 51 Seal member
50 Lid
60 Connection means

The invention claimed is:

1. A cooler for cooling a semiconductor module, the cooler being securable to a base, and the cooler comprising:
a cooler body that comprises a refrigerant flow path defined by (i) a first wall part having a first through-hole, (ii) a second wall part that is arranged facing the first wall part and that comprises a connection region which is connectable to the base at a position opposing the first through-hole, the connection region of the second wall part having a second through-hole, and a maximum inner diameter of the first through hole being greater than a maximum inner diameter of the second through-hole, and (iii) a side wall part for connecting a periphery of the first wall part and a periphery of the second wall part; and
a lid for closing off the first through-hole.

2. The cooler according to claim 1, wherein the cooler further comprises a securing member small enough to be capable of passing through the first through-hole, the securing member being inserted through the second through-hole to secure the cooler body to the base.

3. The cooler according to claim 2, wherein an inner diameter of a refrigerant-flow-path-side of the second through-hole is greater than an inner diameter of a base-side of the second through-hole.

4. The cooler according to claim 3, wherein:
the securing member comprises a screw having a head part and a screw part; and
the refrigerant-flow-path side of the second through-hole comprises a groove which accommodates the head part of the screw such that the head part does not protrude into the refrigerant flow path.

5. The cooler according to claim 4, further comprising a seal member between the second through-hole and the securing member.

6. The cooler according to claim 3, further comprising a seal member between the second through-hole and the securing member.

7. The cooler according to claim 2, further comprising a seal member between the second through-hole and the securing member.

8. The cooler according to claim 1, wherein a wall part is provided in the connection region of the second wall part such that a wall thickness of the wall part is less than a wall thickness in other regions of the second wall part.

9. The cooler according to claim 1, wherein a plurality of fins are connected so as not to block the first through-hole on a refrigerant-flow-path side of the first wall part.

10. The cooler according to claim 1, wherein the lid is detachable from the first wall part.

11. The cooler according to claim 1, wherein the lid, when fully received in the first through-hole, does not to protrude from a refrigerant-flow-path side of the first wall part into the refrigerant flow path.

12. The cooler according to claim 1, wherein:
the semiconductor module is securable to an outer side of the first wall part; and a thickness of the first wall part is less than a thickness of the second wall part.

* * * * *